(12) United States Patent
Shah et al.

(10) Patent No.: US 12,394,683 B2
(45) Date of Patent: Aug. 19, 2025

(54) MOLDED SEMICONDUCTOR CHIP PACKAGE WITH STAIR-STEP MOLDING LAYER

(71) Applicant: ADVANCED MICRO DEVICES, INC., Santa Clara, CA (US)

(72) Inventors: Priyal Shah, San Jose, CA (US); Rahul Agarwal, Livermore, CA (US); Milind S. Bhagavat, Broomfield, CO (US); Chia-Hao Cheng, Hsinchu (TW)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/822,353

(22) Filed: Mar. 18, 2020

(65) Prior Publication Data
US 2021/0296194 A1    Sep. 23, 2021

(51) Int. Cl.
| H01L 23/31  | (2006.01) |
| H01L 21/304 | (2006.01) |
| H01L 21/56  | (2006.01) |
| H01L 23/00  | (2006.01) |
| H01L 25/00  | (2006.01) |
| H01L 25/065 | (2023.01) |

(52) U.S. Cl.
CPC ...... *H01L 23/3128* (2013.01); *H01L 21/3043* (2013.01); *H01L 21/56* (2013.01); *H01L 21/561* (2013.01); *H01L 23/3121* (2013.01); *H01L 24/96* (2013.01); *H01L 25/0655* (2013.01); *H01L 25/50* (2013.01)

(58) Field of Classification Search
CPC ... H01L 21/561; H01L 24/96; H01L 23/3121; H01L 25/50; H01L 25/0655
See application file for complete search history.

(56) References Cited

U.S. PATENT DOCUMENTS

| 8,093,697 | B2* | 1/2012 | Haba ............... H01L 25/105 257/686 |
| 8,409,920 | B2* | 4/2013 | Pendse ............ H01L 25/03 257/713 |
| 9,318,404 | B2* | 4/2016 | Lin ............... H01L 21/561 |
| 9,620,430 | B2* | 4/2017 | Lu ................ H01L 21/563 |
| 10,510,561 | B2* | 12/2019 | Tsai ............... H01L 23/5385 |

(Continued)

FOREIGN PATENT DOCUMENTS

| JP | 2014500632 A    | 1/2014 |
| KR | 20130083478 A   | 7/2013 |

(Continued)

OTHER PUBLICATIONS

International Search Report and Written Opinion, PCT/US2021/022875, Jun. 28, 2021, 16 pages.

(Continued)

*Primary Examiner* — Dale E Page
*Assistant Examiner* — Abbigale A Boyle

(57) ABSTRACT

Various molded semiconductor chip packages are disclosed. In one aspect, a semiconductor chip package includes a routing substrate and a semiconductor chip mounted on and electrically connected to the routing substrate. The semiconductor chip has plural side surfaces. A molding layer at least partially encases the semiconductor chip. The molding layer has a tread and a riser, the riser abutting at least some of the side surfaces.

22 Claims, 15 Drawing Sheets

(56) References Cited

U.S. PATENT DOCUMENTS

| | | |
|---|---|---|
| 10,510,721 B2 * | 12/2019 | Bhagavat ............ H01L 23/5384 |
| 11,121,006 B2 * | 9/2021 | Wang .................... H01L 21/481 |
| 11,164,755 B1 * | 11/2021 | Li ....................... H01L 25/0652 |
| 11,387,209 B2 * | 7/2022 | Yeh ......................... H01L 24/19 |
| 2005/0212129 A1 | 9/2005 | Huang et al. |
| 2010/0283128 A1 | 11/2010 | Chen |
| 2011/0241186 A1 | 10/2011 | Nalla et al. |
| 2013/0003319 A1 * | 1/2013 | Malatkar ............... H01L 23/562 |
| | | 361/728 |
| 2013/0049227 A1 * | 2/2013 | Kim ........................ H01L 25/50 |
| | | 257/E21.602 |
| 2013/0075892 A1 | 3/2013 | Lin et al. |
| 2013/0122689 A1 | 5/2013 | Wang et al. |
| 2013/0154062 A1 | 6/2013 | Lin et al. |
| 2013/0244403 A1 | 9/2013 | Hwang et al. |
| 2014/0167199 A1 | 6/2014 | Cheng et al. |
| 2014/0217597 A1 | 8/2014 | Lin et al. |
| 2014/0264885 A1 | 9/2014 | Tsai et al. |
| 2015/0287697 A1 * | 10/2015 | Tsai ........................ H01L 24/97 |
| | | 257/773 |
| 2015/0366085 A1 | 12/2015 | Shih et al. |
| 2019/0051594 A1 | 2/2019 | Yamamoto |
| 2019/0051633 A1 | 2/2019 | Bhagavat et al. |
| 2019/0326221 A1 | 10/2019 | Bhagavat et al. |

FOREIGN PATENT DOCUMENTS

| | | |
|---|---|---|
| WO | 2007060812 A1 | 5/2007 |
| WO | 2012087474 A2 | 6/2012 |
| WO | 2017179326 A1 | 10/2017 |
| WO | 2019032322 A1 | 2/2019 |

OTHER PUBLICATIONS

Wikipedia; *Saw*; https://en.wikipedia.org/wiki/Saw#Terminology; pp. 1-12.

* cited by examiner

MOLDED SEMICONDUCTOR CHIP PACKAGE WITH STAIR-STEP MOLDING LAYER

BACKGROUND OF THE INVENTION

A conventional fan-out semiconductor chip package consists of a semiconductor chip mounted on a redistribution layer (RDL) structure that is composed of one or more layers of metallization interspersed in a polymer, such as polyimide. The chip is electrically connected to the conductor structures of the RDL structure by way of solder bumps. The chip itself is encased in a molding material that is typically planarized to form a flat upper surface. Solder balls are attached to the underside of the RDL structure to enable the fan-out package to be connected to some other circuit board, such as a system board. Silicon, which is commonly used for semiconductor chips, exhibits a certain coefficient of thermal expansion "CTE". Typical molding compounds and polyimide have CTEs that differ sometimes significantly from that of silicon. To help alleviate issues of CTE mismatch, an underfill material is typically interposed between the semiconductor chip and the underlying RDL structure.

The process to mount a chip on a RDL structure and encase it in molding material is often termed "wafer reconstitution" since many such chips are mounted on electrically discrete but physically joined RDL structures. In conventional processes, a combination of the chip, molding layer and the underlying RDL structure is singulated from the adjacent such combinations to yield a molded semiconductor chip package. A conventional singulation process entails cutting a single kerf through the molding layer and the RDL structure along four dicing streets for each package. This single cut process leaves the molding layer with a substantially, continuous side wall.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
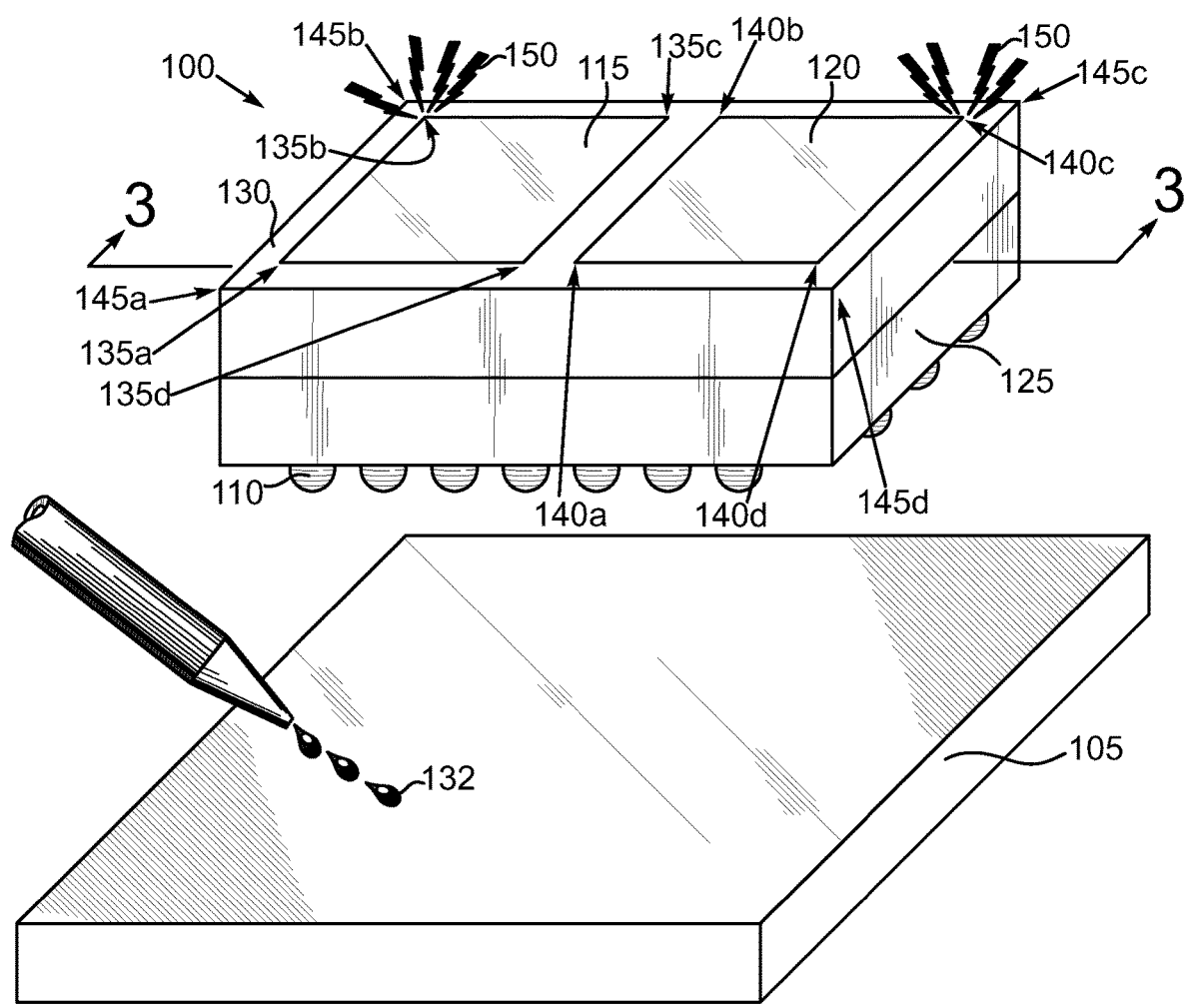
FIG. 1 is a partially exploded pictorial view of an exemplary conventional molded semiconductor chip package.

The conventional molded package process described in the Background above leaves a flat, continuous molding layer sidewall that surrounds the perimeter of a mounted chip, including the corners thereof. Molded packages undergo various thermal cycling steps, both during testing and actual operation. These thermal cycling steps produce stresses, particularly at the corners of the chips. These stresses can create a variety of defects in the chips, such as plural cracks emanating from the corners and projecting into the interior of the chip. If unabated, these cracks can lead to device failure for the chip. Part of the reason that the molding layer exerts such stresses on the semiconductor chip and particularly the corners or the corner thereof is an artifact of the singulation process used to singulate the molded package from a reconstituted wafer of which it was formally a part. The singulation process leaves a relatively thick sidewall of the molding layer. The thick sidewall presents enough material that when subjected to thermal cycling imposes significant stresses on the corners of the chip. The thick molding layer sidewall combined with thermal stresses also raise the risk of cracking of the molding material proximate the chip corners.

The disclosed arrangements provide a molded semiconductor chip package with a stair-step molding layer that reduces the amount of molding material proximate the side surfaces and corners of the chip(s) at least partially encased by the molding layer. In this way, mechanical stresses on the chip and molding layer corners during thermal cycling are reduced. A variety of techniques are disclosed to craft the stair-step molding layer. Additional details will now be described.

In accordance with one aspect of the present invention, a semiconductor chip package includes a routing substrate and a semiconductor chip mounted on and electrically connected to the routing substrate. The semiconductor chip has plural side surfaces. A molding layer at least partially encases the semiconductor chip. The molding layer has a tread and a riser, the riser abutting at least some of the side surfaces.

The semiconductor chip package wherein the riser is narrower than the tread.

The semiconductor chip package wherein the routing substrate comprises a redistribution layer (RDL) structure.

The semiconductor chip package wherein the routing substrate comprises an interposer.

The semiconductor chip package comprising another semiconductor chip mounted on the routing substrate and the routing substrate comprises another molding layer containing an interconnect chip connecting the semiconductor chip to the another semiconductor chip.

The semiconductor chip package wherein the semiconductor chip includes four side surfaces and the riser abuts all four of the side surfaces.

The semiconductor chip package comprising another semiconductor chip mounted on the routing substrate and at least partially encased by the molding layer.

The semiconductor chip package wherein the routing substrate comprises plural interconnect structures to electrically connect the semiconductor chip package to another electronic device.

In accordance with another aspect of the present invention, a reconstituted wafer includes plural semiconductor chip packages. Each of the semiconductor chip packages includes a routing substrate, a semiconductor chip having plural side surfaces and being mounted on and electrically connected to the routing substrate, and a molding layer at least partially encasing the semiconductor chip, the molding layer having a tread and a riser, the riser abutting at least some of the side surfaces.

The reconstituted wafer wherein the risers are narrower than the treads.

The reconstituted wafer wherein the routing substrates comprises redistribution layer (RDL) structures.

The reconstituted wafer wherein the routing substrates comprises interposers.

The reconstituted wafer wherein each of the semiconductor chip packages comprises another semiconductor chip mounted on the routing substrate, the routing substrate comprises another molding layer containing an interconnect chip connecting the semiconductor chip to the another semiconductor chip.

The reconstituted wafer wherein each of the semiconductor chips include four side surfaces and the each of the risers abuts all four of the side surfaces of each of the semiconductor chips.

The reconstituted wafer wherein each of the semiconductor chip packages comprises another semiconductor chip mounted on the routing substrate and at least partially encased by the molding layer.

The reconstituted wafer wherein each of the routing substrates comprises plural interconnect structures to electrically connect to another electronic device.

In accordance with another aspect of the present invention, a method of manufacturing a semiconductor chip package includes mounting a semiconductor chip having plural side surfaces on a routing substrate and electrically connecting the semiconductor chip to the mounting substrate. A molding layer is molded on the routing substrate to at least partially encase the semiconductor chip. The molding layer has a tread and a riser, the riser abutting at least some of the side surfaces.

The method comprising fabricating the tread and the riser during the molding.

The method comprising fabricating the tread and the riser by sawing a first kerf having a first width to set a width of the riser and sawing a second kerf aligned with the first kerf and having a second width narrower than the first width to set a width of the tread.

The method comprising sawing the first kerf and the second kerf into the same side of the molding layer.

The method comprising sawing the first kerf and the second kerf into the opposite sides of the molding layer.

The method wherein the routing substrate and the molding layer comprises a reconstituted wafer.

The method wherein the riser is narrower than the tread.

The method wherein the routing substrate comprises a redistribution layer (RDL) structure.

The method wherein the routing substrate comprises an interposer.

The method comprising mounting another semiconductor chip on the routing substrate, the routing substrate comprises another molding layer containing an interconnect chip connecting the semiconductor chip to the another semiconductor chip.

The method wherein the semiconductor chip includes four side surfaces and the riser abuts all four of the side surfaces.

The method comprising mounting another semiconductor chip on the routing substrate and at least partially encasing the another semiconductor chip with the molding layer.

In the drawings described below, reference numerals are generally repeated where identical elements appear in more than one figure. Turning now to the drawings, and in particular to FIG. 1, therein is shown a partially exploded pictorial view of an exemplary conventional molded fan-out semiconductor chip package (molded package) 100 that is designed to be mounted on a package substrate 105 and electrically connected thereto by way of plural solder balls 110. In this conventional arrangement the molded package 100 includes two semiconductor chips 115 and 120 mounted on a RDL structure 125 and partially encased by a molding layer 130. An underfill 132 is placed between the RDL structure 125 and the package substrate 105 to lessen the effects of differences in coefficients of thermal expansion (CTE) of the semiconductor chips 115, 120, the RDL structure 125 and the package substrate 105. Additional details of the RDL structure 125 will be described below in conjunction with a subsequent figure. The semiconductor chip 115 is a generally rectangular structure that includes four corners 135a, 135b, 135c and 135d. The semiconductor chip 120 is similarly rectangular and includes four corners 140a, 140b, 140c and 140d. The molding layer 130 and the RDL structure 125 along with the semiconductor chips 115 and 120 were formally part of a reconstituted wafer (not shown) and thereafter singulated. Accordingly, the molding layer 130 is also a rectangular structure with corners 145a, 145b, 145c and 145d. The molding layer 130 has undergone a grinding process to expose the tops of the chips 115 and 120. The corners 145a and 145b of the molding layer 130 are proximate the corners 135a and 135b, respectively, of the chip 115 and the corners 145c and 145d of the molding layer 130 are proximate the corners 140c and 140d, respectively, of the chip 120.

During certain types of testing and actual operation, the molded package 100 can undergo thermal cycling. This thermal cycling produces bending, torsional and other types of stresses in both the RDL structure 125 and the molding layer 130. This repeated flexing and twisting places significant stresses on the semiconductor chips 115 and 120 and the molding layer 130, particularly at the corners 135a and 135b of the chip 115 proximate the corners 145a and 145b of the molding layer 130 and at the corners 140c and 140d of the chip 120 proximate the corners 145c and 145d also of the molding layer 130. Here for illustration purposes, the thermal stresses imposed on the corners 135b and 140c of the chips 115 and 120, respectively, and the molding layer corners 145c and 145d, respectively, are depicted schematically and labeled 150.

Figure 2:
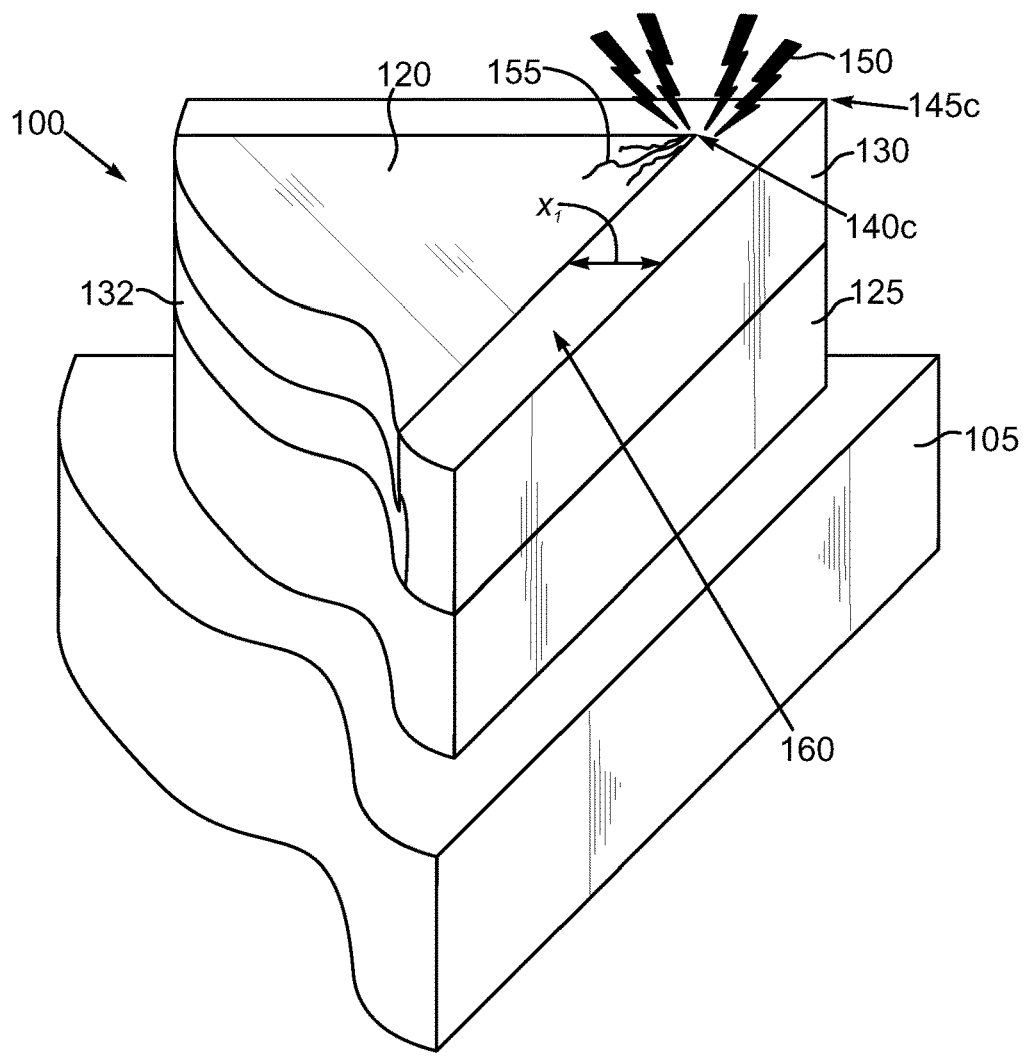
FIG. 2 is a pictorial view of a small portion of a corner of the conventional molded package depicted in FIG. 1.

FIG. 2 is a pictorial view of the corner 140c of the semiconductor chip 120 and the corner 145c of the molding layer 130 shown enlarged relative to the view in FIG. 1. Note that a portion of the underlying RDL structure 125, the underfill 132 as well as the package substrate 105 are also depicted. As noted above, the thermal cycling of the package 100 produces stresses 150 particularly at the corners of the chips, such as the corner 140c of the chip 120. These stresses can create a variety of defects in the chip 120, such as plural cracks 155 emanating from the corner 140c and projecting into the interior of the chip 120. If unabated, these cracks 155 can lead to device failure for the chip 120. Other types of defects that can occur include flaking, chunk out and the like. Part of the reason that the molding layer 130 exerts such stresses on the semiconductor chip 120 and particularly the corners or the corner 140c thereof is an artifact of the singulation process used to singulate the molded package 100 from the reconstituted wafer (not shown) from which it was formally a part. The singulation process leaves a relatively thick sidewall 160 of the molding layer 130. The sidewall 160 surrounds three sides each of the semiconductor chip 115 and the semiconductor chip 120. The sidewall 160 has some width, $x_1$, and presents enough material that when subjected to thermal cycling imposes significant stresses 150 on the corner 140c of the chip 120 and the other chip corners depicted in FIG. 1.

Additional details of the conventional molded package 100 will now be described in conjunction with FIG. 3, which is a sectional view of FIG. 1 taken at section 3-3. The semiconductor chips 115 and 120 are electrically connected to the RDL structure 125 by way of plural solder bumps 165. Each of the semiconductor chips 115 is provided with an underfill material layer 170 to cushion the effects of differences in CTE between the chips 115 and 120 and the other structures in the package 100, particularly the RDL structure 125. The RDL structure 125 consists of plural conductor traces 175 interspersed in multiple layers of dielectric material 180. Various conductors of the RDL structure 125 are connected to the solder balls 110. The underfill 132 performs the same function, that is, alleviating the impacts of differences in CTE between the molded package 100 and the underlying package substrate 105. As noted above in conjunction with FIG. 2, the sidewall 160 of the molding layer 130 has some width 160 that is a function of the way in which the molded package 100 is singulated from a reconstituted wafer (not shown).

Figure 4:
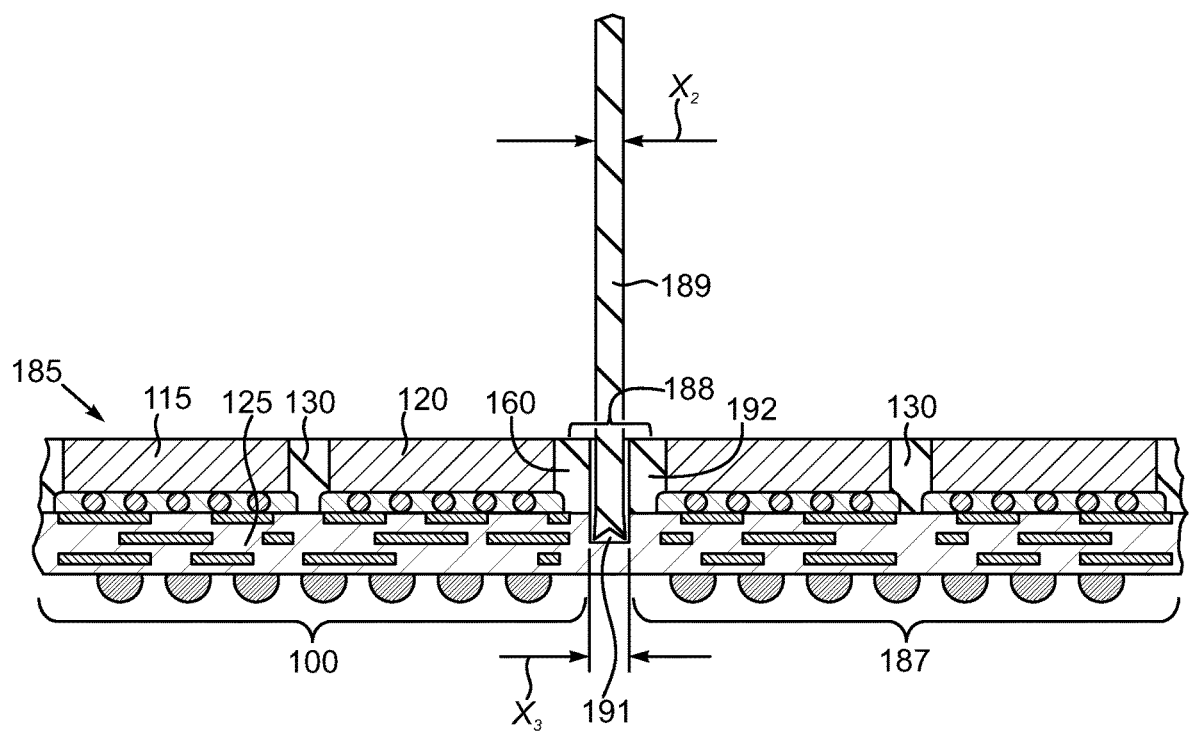
FIG. 4 is a sectional view of a small portion of a conventional reconstituted wafer and conventional singulation process.

As just noted, the molded package 100 is initially fabricated as part of a reconstituted wafer and thereafter singulated and in such a way to leave the aforementioned sidewall 160 with some lateral dimension $x_1$. Attention is now turned to FIG. 4, which is a sectional view depicting the conventional molded package 100 as part of a conventional reconstituted wafer 185 during a singulation process. An adjacent molded package 187 of the reconstituted wafer 185 is shown to the right of the molded package 100. Only a small portion of the reconstituted wafer 185 is shown, so of course it should be understood that the reconstituted wafer 185 can include scores of such molded packages 100 and 187. The reconstituted wafer 185 includes plural dicing streets between molded packages, such as the dicing street 188 between the molding packages 100 and 187. The molded package 100 is diced from the reconstituted wafer 185 by way of plural sawing movements by a dicing saw blade 189 at the dicing street 188 and other dicing streets (not visible). Here the dicing blade 189 has some width $x_2$ which is suitable to cut a kerf 191 at the dicing street 188 with a lateral dimension $x_3$ in and through the molding layer 130 and ultimately down through the RDL structure 125, where $x_3 > x_2$. This dicing operation is performed typically four times, two parallel cuts in one direction and two parallel cuts in a direction perpendicular to the first dicing direction in order to singulate the molded package 100 and so on for the molding package 187. Note that the dicing operation is performed with a single vertical cut at each dicing street 188 to produce the kerf 191 and others like it with the lateral dimension $x_3$ such that when the molded package 100 is singulated the aforementioned sidewall 160 with dimension $x_2$ is established, and a corresponding sidewall 192 is defined around the molded package 187.

Figure 5:
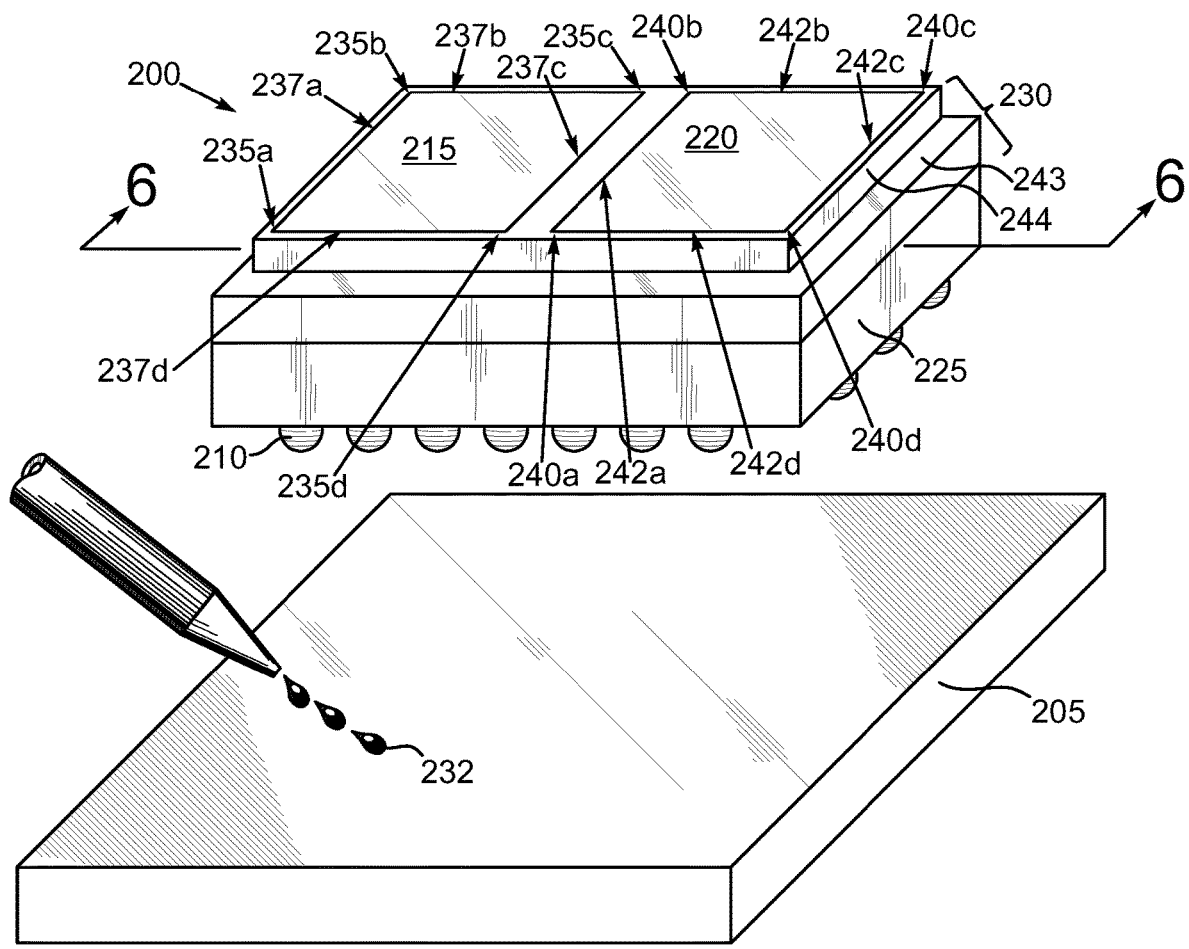
FIG. 5 is a partially exploded pictorial view of an exemplary new arrangement of a molded chip package that includes a stair-step molding layer.

An exemplary new arrangement of a molded package 200 can be understood by referring now to FIG. 5, which is a partially exploded pictorial view. Here, the molded package 200 is shown exploded from an underlying package substrate 205. The package substrate 205 can be a ball grid array, a pin grid array, a land grid array, or other type of interconnect scheme in order to connect to some other electronic device or circuit board. The molded packaging 200 in this illustrative arrangement is electrically connected to the package substrate 205 by way of plural interconnect structures 210, which may be solder balls, bumps, microbumps, conductive pillars or other types of interconnect structures. In this exemplary arrangement the molded package 200 includes two semiconductor chips 215 and 220 mounted on a routing substrate 225 and partially encased by a molding layer 230. In this arrangement, the routing substrate 225 can be a RDL structure. Other arrangements disclosed herein can use an interposer or another molding layer as the routing substrate. An underfill 232 is placed between the routing substrate 225 and the package substrate 205 to lessen the effects of differences in coefficients of thermal expansion CTE of the semiconductor chips 215, 220, the routing substrate 225 and the package substrate 205. Additional details of the routing substrate 225 will be described below in conjunction with a subsequent figure.

The semiconductor chip 215 is a generally rectangular structure that includes four corners 235a, 235b, 235c and 235d defined by the intersections of four side surfaces 237a, 237b, 237c and 237d. The semiconductor chip 220 is similarly rectangular and includes four corners 240a, 240b, 240c and 240d defined by the intersections of respective side surfaces 242a, 242b, 242c and 242d. Of course, one or both of the chips 215 and 220 could have square footprints. The semiconductor chips 215 and 220 are at least partially encased by way of a molding layer 230 molded on the routing substrate 225. As described in more detail below, the molding layer 230 and the routing substrate 225 along with the semiconductor chips 215 and 220 are fabricated on a reconstituted wafer (not shown) and thereafter singulated.

The molding layer 230 has undergone an optional grinding process to optionally expose the tops of the chips 215 and 220.

Figure 3:
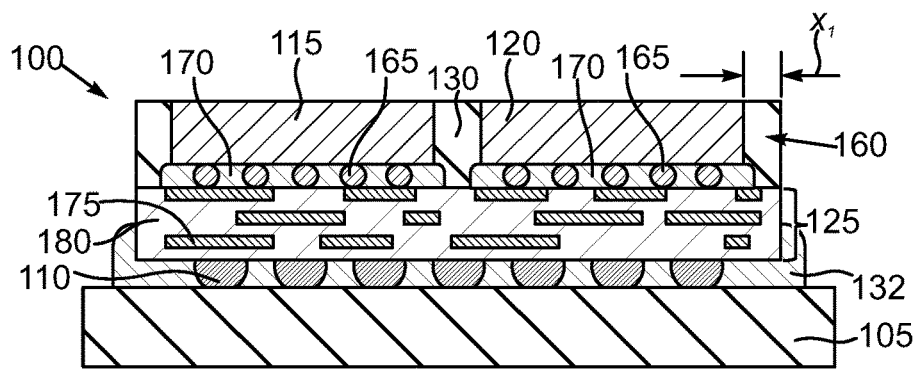
FIG. 3 is a sectional view of FIG. 1 taken at section 3-3.

In the foregoing conventional molded package design shown in FIGS. 1-3, the molding layer 130 has a continuous substantially vertical sidewall. However, in the new illustrative arrangement depicted in FIG. 5, the molding layer 230 is a stair-step arrangement, which includes a tread 243 and a riser 244 that projects upwardly from the tread 243. The riser 244 has the form of a peripheral wall that extends around the perimeter of the combination of the chips 215 and 220, and in particular around the side surfaces 237a, 237b and 237d of the chip 215 and the side surfaces 242b, 242c and 242d of the chip 220. Additional details of the molding layer 230 can be understood by referring now also to FIG. 6, which is a sectional view of FIG. 5 taken at section 6-6. Preliminarily, it is noted that the semiconductor chips 215 and 220 can be electrically connected to the routing substrate 225 by way of plural interconnect structures 265. The interconnect structures 265 can be solder bumps, solder microbumps, conductive pillars or other types of interconnect structures. Underfill 270 is positioned between the chips 215 and 220 and the underlying routing substrate 225. The routing substrate 225 can consist of plural conductive traces 275 and vias (not shown) as well as multiple layers of a dielectric material 280, such as polyimide, various epoxies or other types of dielectric materials. The underfill 270 and the underfill 232 function to alleviate issues of differential CTEs associated with the chips 215 and 220 and the underlying RDL 225 and the molded package 200 and the underlying package substrate 205. Here, the riser 244 proximate the side surfaces 237a and 242c of the chips 215 and 220, respectively, is visible. As noted briefly above, the riser 244 has a relatively thin lateral dimension $x_4$, which translates into a much smaller volume of the molding material of the molding layer 230 proximate the corners 235a and 235b (and to a lesser extent to the corners 235b and 235c) of the chip 215, and the corners 240c and 240d (and to a lesser extent to the corners 240a and 240b) of the chip 220, and thus reduces the stresses associated with thermal cycling on those corners 235a, 235b, 235c, 235d, 240a, 240b, 240c and 240d. Note that the tread 243 projects above the underfill 270 of the chip 220. This is by design and will be described in more detail below. Note the location of the dashed rectangle 282. The portion of FIG. 6 circumscribed by the dashed rectangle 282 will be shown at greater magnification in FIG. 7.

Figure 6:
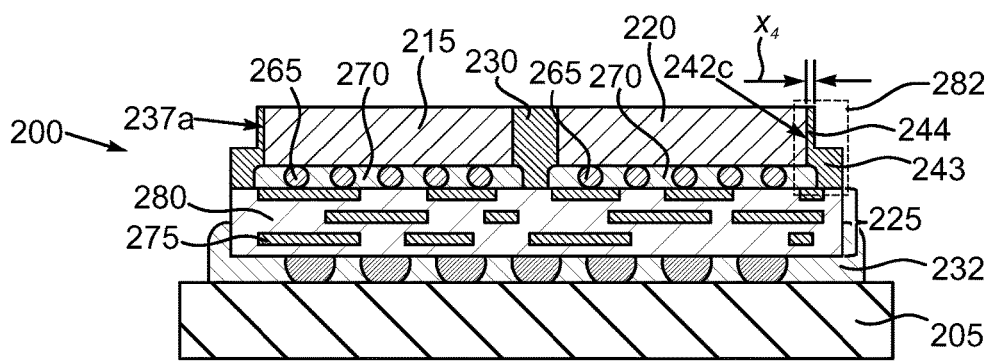
FIG. 6 is a sectional view of FIG. 5 taken at section 6-6.
Figure 7:
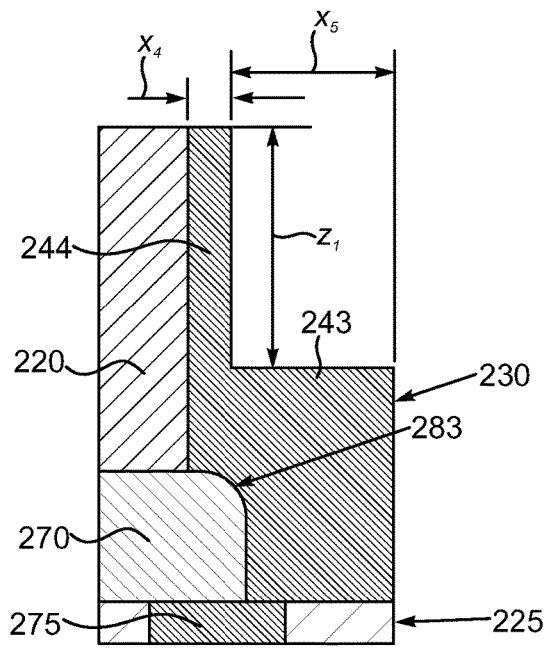
FIG. 7 is a small portion of FIG. 6 depicted at greater magnification.

Additional details of the molding layer 230 can be understood by referring now also to FIG. 7, which as just noted, is a magnified view of the portion of FIG. 6 circumscribed by the small dashed rectangle 282. Note that because of the location of the dashed rectangle 282 in FIG. 6, a small portion of the semiconductor chip 220, the underfill 270 thereof, the molding 230 and one of the underlying traces 275 of the routing substrate 225 are all visible in FIG. 7. As noted above, the riser 244 has some lateral dimension $x_4$ that is preferably much smaller than the lateral dimension $x_2$ of the conventional molding layer 130 depicted in FIG. 1. The riser 244 has some height $z_1$ above the tread 243 and the tread 243 has some lateral dimension $x_5$. The height $z_1$ of the riser 244 is selected to ensure that the corner 283 of the underfill 270 is not jeopardized during the fabrication of the molded package 100. In this illustrative arrangement, the lateral dimension $x_4$ of the riser 244 is less than the lateral dimension $x_5$ of the tread 243. However, the lateral dimension $x_4$ of the riser 244 could be equal to or differ from the lateral dimension $x_5$ of the tread 243.

Figure 8:
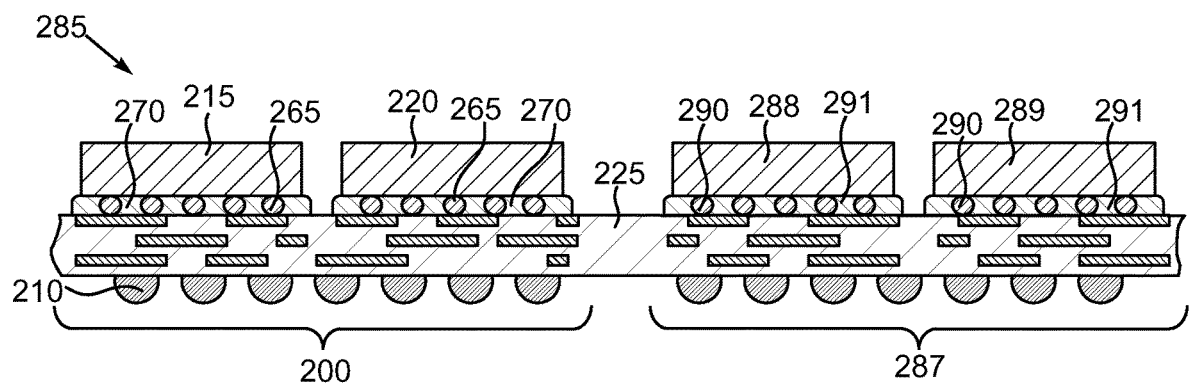
FIG. 8 is a sectional view of a small portion of a reconstituted wafer with plural semiconductor chips mounted thereon.

An exemplary method for fabricating the molded package 200 can be understood by referring now to FIGS. 8, 9, 10, 11, 12 and 13 and initially to FIG. 8. FIG. 8 is a sectional view of a small portion of a reconstituted wafer 285 that includes the semiconductor chips 215 and 220 mounted on an expansive routing substrate 225. The general footprint of the molded package 200 is depicted and an adjacent molded package is shown and labeled 287, which includes semiconductor chips 288 and 289. The semiconductor chips 215, 220, 288 and 289 can be can be any of a variety of integrated circuits. A non-exhaustive list of examples includes processors, such as microprocessors, graphics processing units, accelerated processing units that combine aspects of both, memory devices, systems-on-chip, an application integrated specific circuit or other. The chips 215 and 220 are, as noted above, electrically connected to the underlying routing substrate 225 by way of interconnect structures 265 and protected from CTE issues by way of the respective underfills 270. The chips 288 and 289 are similarly connected to the routing substrate 225 by interconnect structures 290 and protected from CTE issues by respective underfills 291. Up to this point the chips 215, 220, 288 and 289 and the routing substrate 225 have undergone multitudes of process steps required for integrated circuit and RDL fabrication. The chips 215, 220, 288 and 289 have been singulated from a larger semiconductor workpiece (not shown) and mounted on the routing substrate 225 and the interconnect structures 210 have been mounted on the opposite side thereof. It should be understood that there can be scores of such molded packages 200 and 287 that make up part of the reconstituted wafer 285 at this stage. The initial processing of the reconstituted wafer 285 just described is a die-last process. However, the skilled artisan will appreciate that a die-first process could be used with the techniques described herein.

Figure 9:
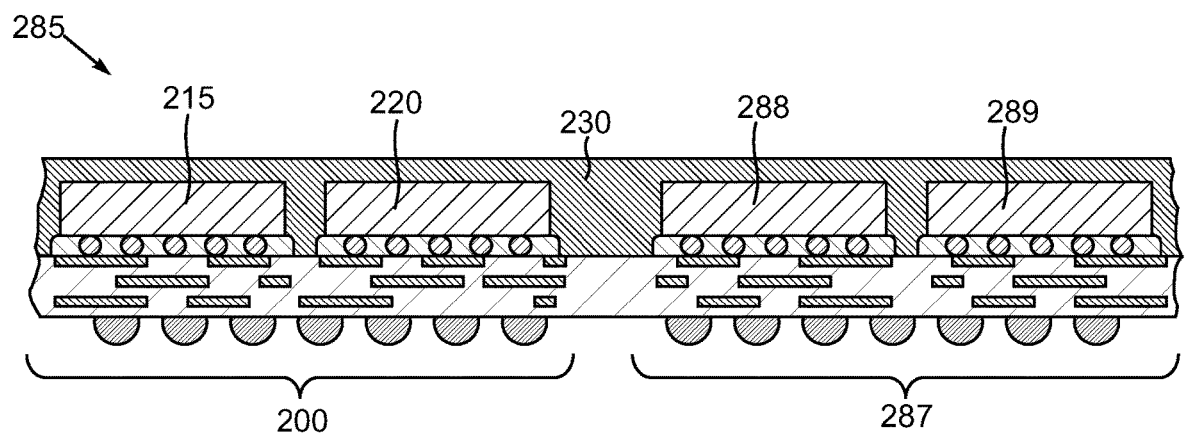
FIG. 9 is a sectional view like FIG. 8 but depicting exemplary molding of a molding layer.

Next and as shown in FIG. 9, the molding layer 230 is applied to the reconstituted wafer 285 so as to encase the semiconductor chips 215, 220, 288 and 289 and those other chips on the reconstituted wafer 285 that are not visible in FIG. 9. The molding layer 230 can be applied using well-known compression molding techniques using various molding materials. Some commercial examples include Nagase R4601 or R460, Sumitomo EME-G750 series or EME-G760 series or the like.

Figure 10:
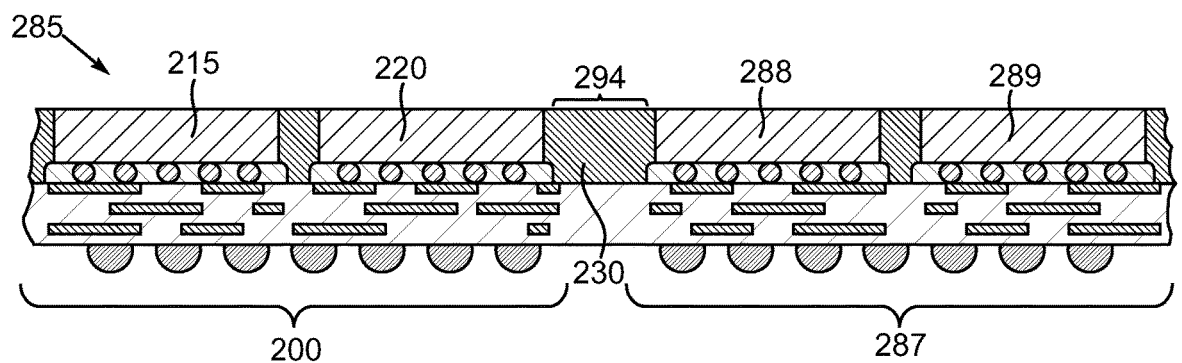
FIG. 10 is a sectional view like FIG. 9 but depicting an exemplary grinding process to planarize the molding layer.

Next and as shown in FIG. 10, an optional grinding process is performed on the molding layer 230 to optionally expose the tops of the semiconductor chips 215, 220, 288 and 289. One dicing street 294 between the molded packages 200 and 287 is visible in FIG. 10. Of course there are multitudes of additional such dicing streets (not visible) across the expanse of the reconstituted wafer 285. An exemplary singulation process to singulate the molding package 200 and yield the aforementioned stair-step molding layer 230 will now be described in conjunction with FIGS. 11, 12 and 13.

Figure 11:
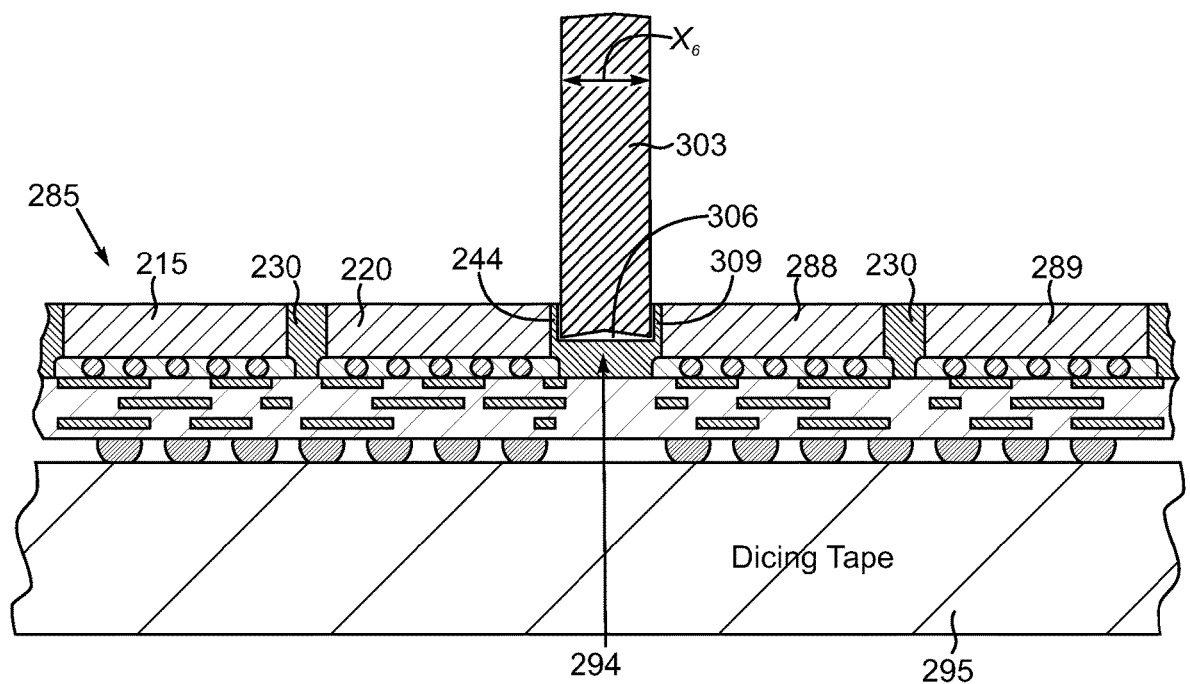
FIG. 11 is a sectional view like FIG. 10 but depicting exemplary wide kerf formation in the molding layer.

Referring initially to FIG. 11, the reconstituted wafer 285 is mounted on a dicing tape 295. With the dicing tape 295 in position, a first dicing sawing step is performed using a dicing saw blade 303 that has some width $x_6$ to cut a kerf 306 at the dicing street 294. The kerf 306 does not extend to the routing substrate 225, but instead extends to a depth equal to the desired height $z_1$ (see FIG. 7) of the riser 244. The kerf 306 establishes the riser 244 and a corresponding but oppositely positioned riser 309 of the molding layer 230 where the molded package 287 is. The width $x_6$ of the dicing blade 303 is selected to be smaller than the width of the gap between the adjacent chips 220 and 288. The width $x_6$ of the dicing blade 303 sets the width $x_4$ (see FIG. 7) of the riser 244 and the corresponding width of the riser 309, which may or may not be equal to the width $x_4$ depending how centered the dicing blade 303 is between the chips 220 and 288 and blade wobble during the cut.

Figure 12:
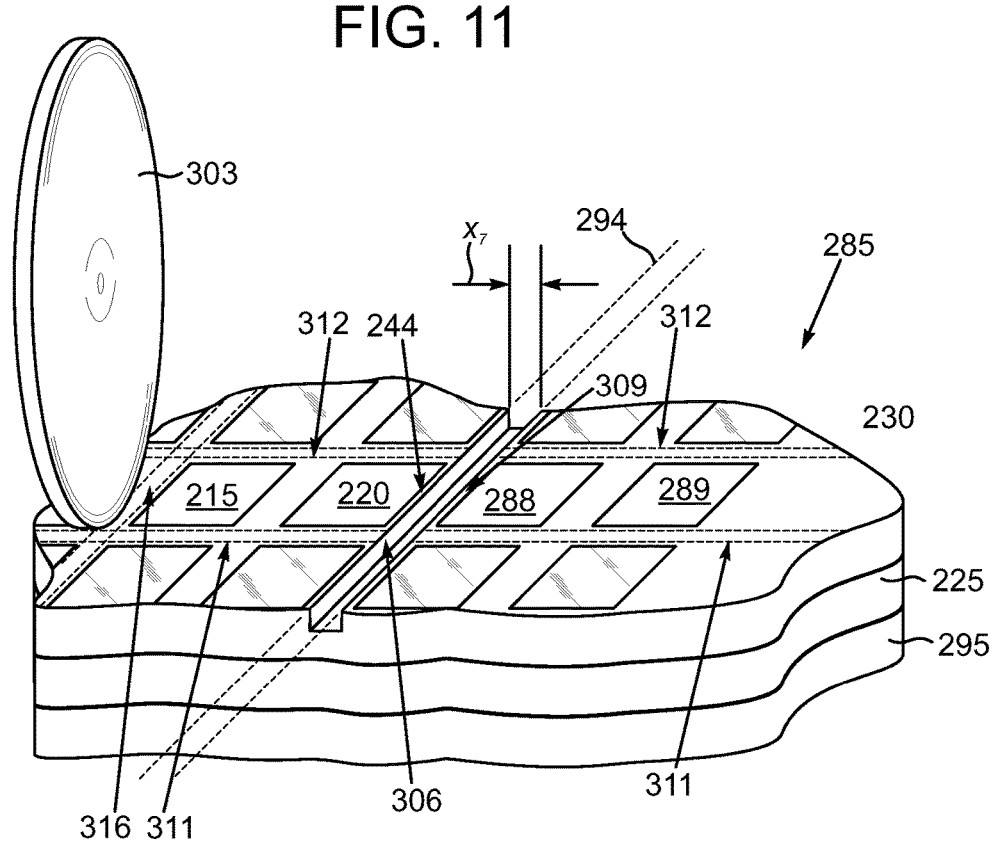
FIG. 12 is a pictorial view depicting the aftermath of the kerf cutting depicted in FIG. 11 and additional dicing operations to be performed.

Additional details of the dicing operations can be understood by referring now also to FIG. 12, which is a pictorial view of a portion of the reconstituted wafer 285 including the molding 230, the underlying routing substrate 225 and the dicing tape 295. The kerf 306 is cut into the molding layer 230 between the semiconductor chips 220 and 288 and other chips that are also to one side or the other of the kerf 306 but are not separately labeled. The kerf 306 is cut with some lateral dimension $x_7$ that is dependent on the width, configuration (toothed, abrasive, etc.) and cutting wobble of the dicing blade 303. The lateral dimension $x_7$ is selected to yield the aforementioned risers 244 and 309 of the molding layer 230 with preferred lateral dimensions $x_4$ (see FIG. 7). Note that the semiconductor chips 215 and 220 are separated from adjacent chips by one or more dicing streets 311 and 312 and another dicing street 316, which is substantially parallel to the dicing street 294 where the kerf 306 has already been cut. Of course following the cutting of the kerf 306 the dicing saw 303 is moved over another dicing street, such as the dicing street 316, and a similar kerf is cut to the same depth and width as the kerf 306 and vice versa albeit in a perpendicular direction for the dicing streets 311 and 312.

Figure 13:
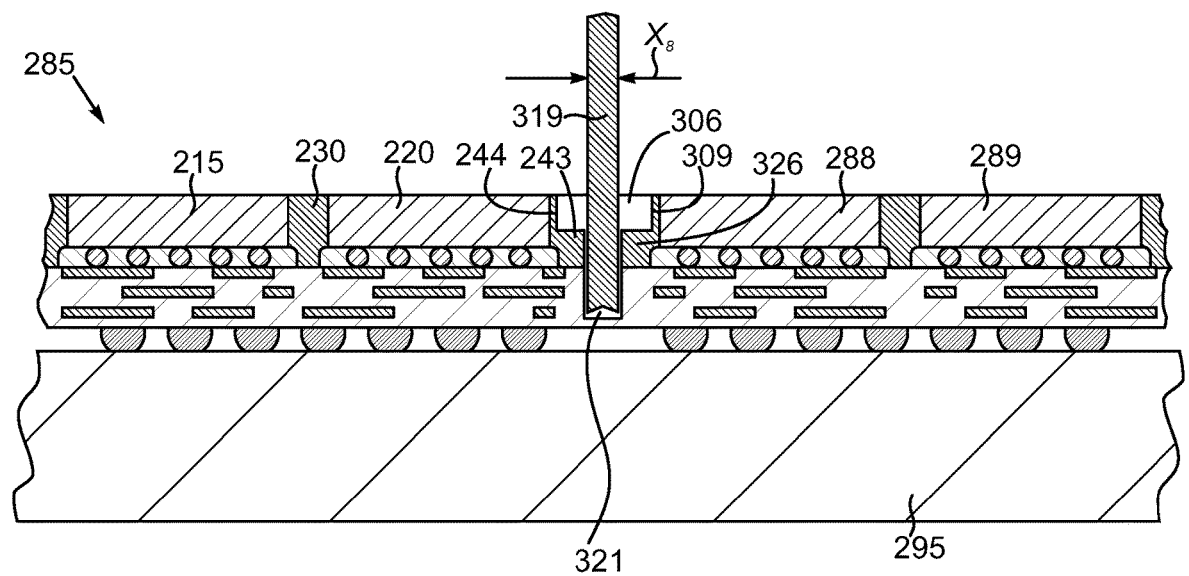
FIG. 13 is a sectional view like FIG. 11 but depicting the formation of a second narrower kerf in the molding layer.

Next and as shown in FIG. 13, a second dicing step is performed to cut a kerf 321 approximately centered in and extending from the bottom of the kerf 306 through the full depth of the molding layer 230 using a dicing saw blade 319. The dicing blade 319 is selected to have a width $x_8$ that is smaller than $x_6$ and is used to fully singulate the molded package 200 from the reconstituted wafer 285. Again four separate cuts on each of the dicing streets 294, 311, 312 and 316 (see FIG. 12) will be performed to complete the singulation of the molded package 200. By using the dicing blade 319 with the lateral dimension $x_8$ which is less that the width $x_6$ of the blade 303, and making that cut substantially at the middle of the dicing street, the singulation can be performed to yield the aforementioned riser 244 and tread 243 of the molding 230 that surrounds the chips 215 and 220. The similar riser 309 and tread 326 surrounding the semiconductor chips 288 and 289 is also established by way of this second dicing step. Following the singulation, the dicing tape 295 can be removed and the molded package 200 yielded.

Figure 14:
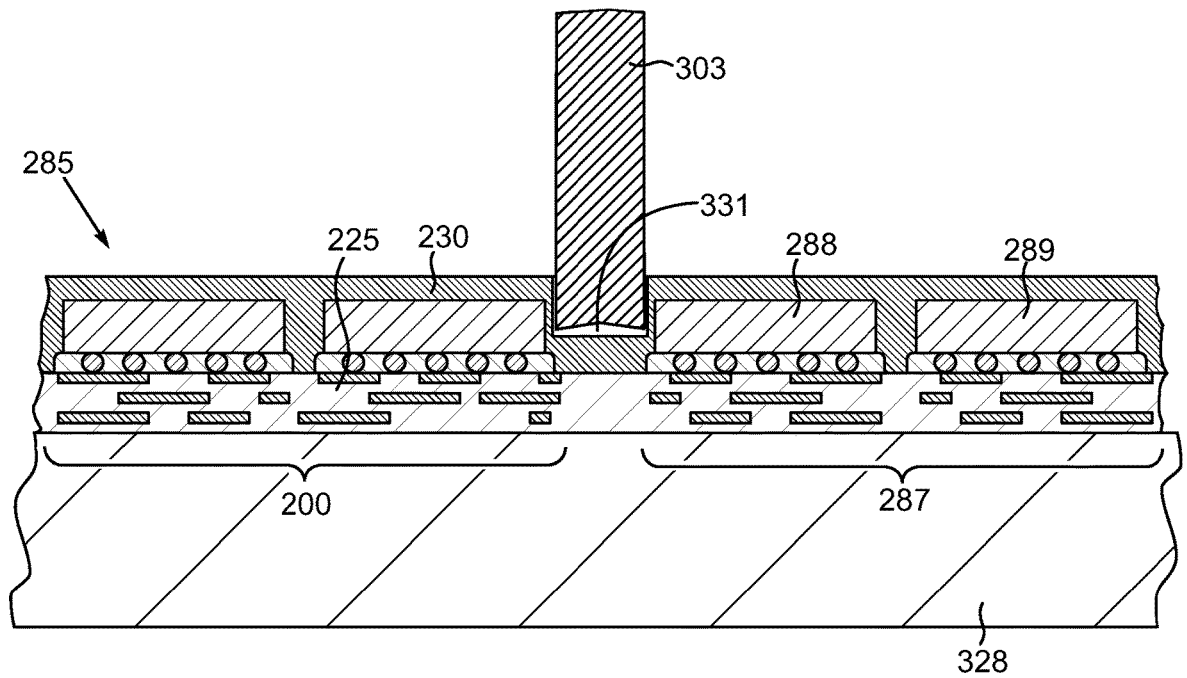
FIG. 14 is a sectional view like FIG. 11 but depicting wide kerf formation in a reconstituted wafer but prior to interconnect attachment.

In the foregoing arrangement, attachment of the interconnect structures 210 (see FIG. 8) precedes singulation. However, in an alternate process flow depicted in FIGS. 14-17, connection of the interconnect structures 210 is intermediary to singulation. Referring initially to FIG. 14, which is a sectional view, the reconstituted wafer 285 is mounted on a carrier wafer 328 with the routing substrate 225 facing down. The carrier wafer 328 can be composed of glasses, semiconductors or the like and attached by way a release layer (not shown). The carrier wafer 328 can be used as a supporting substrate for fabricating the routing substrate 225, the mounting of the semiconductor chips 215, 220, 288 and 289 (and others not visible) of the molded packages 200 and 287, respectively (and others not visible) and the application of the molding layer 230. The processes can be performed using the materials and techniques disclosed elsewhere herein. After the molding layer 230 is molded but before optional grinding thereof, a kerf 306 is cut with the dicing blade 303. This cutting step will be similar to the dicing step depicted in FIGS. 11 and 12. However, because the molding layer 230 has not been ground at this point, the kerf 306 will be initially deeper than what is shown in FIGS. 11 and 12.

Figure 15:
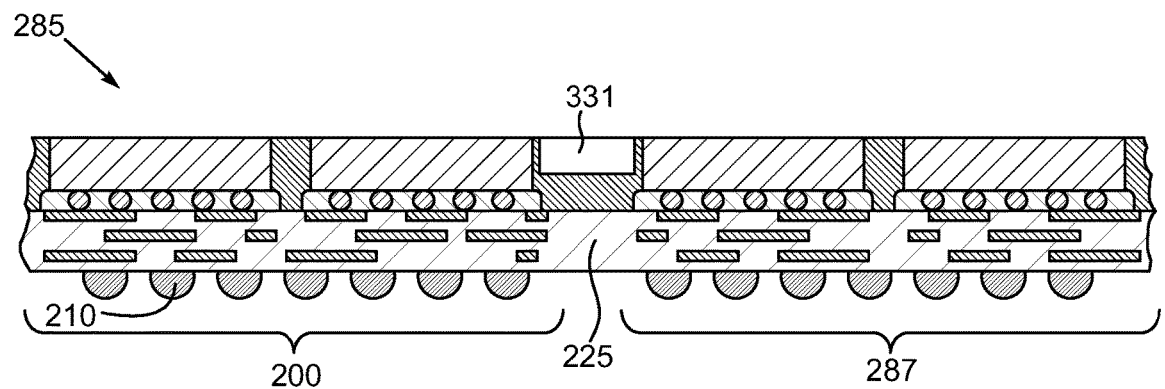
FIG. 15 is a sectional view like FIG. 14 but depicting an exemplary grinding process on the molding layer as well as interconnect connection.

Next and as shown in FIG. 15, the molding layer 230 is subjected to grinding to expose the tops of the semiconductor chips 215, 220, 288 and 289. Next, the carrier wafer 328 shown in FIG. 14 is released using well-known delamination processes and the interconnect structures 210 are attached to the routing substrate 225 at the locations of the molded packages 200 and 287. The depth of the kerf 331 is reduced by the grinding. The reconstituted wafer 285 is now ready to be attached to a dicing tape. Optionally, the grinding of the molding layer 230 can be performed after connection or fabrication of the interconnect structures 210.

Figure 16:
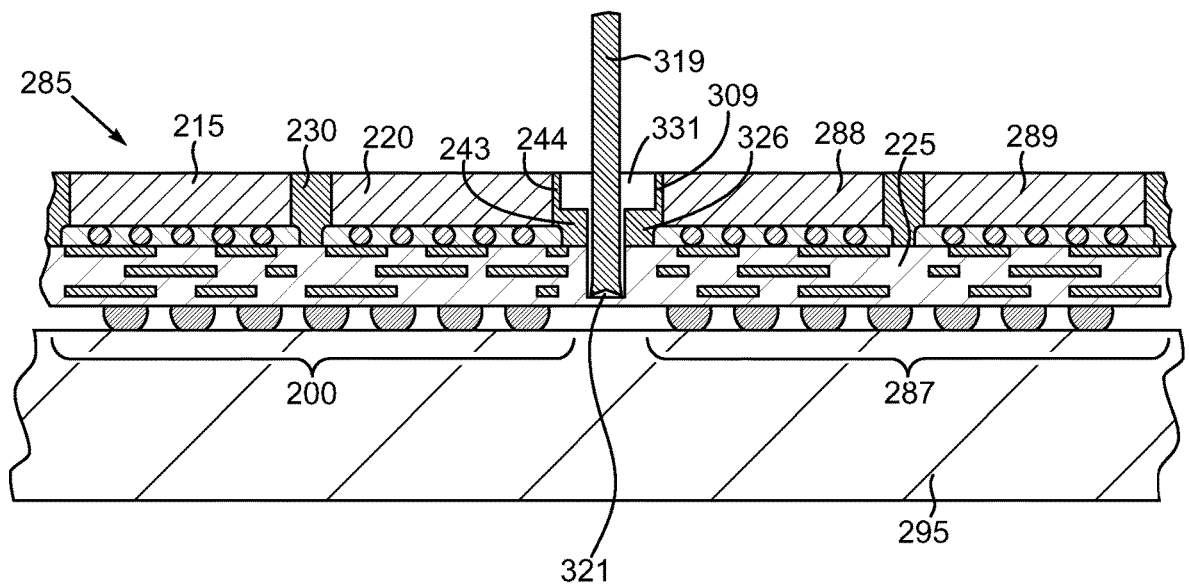
FIG. 16 is a sectional view like FIG. 15 but depicting exemplary narrow kerf formation.

Next and as shown in FIG. 16, the reconstituted wafer 285 is attached to the dicing tape 295 described above. A second dicing operation is performed using the dicing blade 319 to cut the kerf 321 and ultimately singulate the molded package 200 and the molded package 287 from the reconstituted wafer 285 as described above. As noted above, this dicing operation shown between the chips 220 and 288 is performed multiple times at multiple intersecting dicing streets in order to fully singulate the molded packages 200 and 287. Using the two-step dicing procedure, the molding layer 230 is fabricated with the aforementioned riser 244 and tread 243 that surrounds the chips 215 and 220 as described above and in similar fashion for the chips 288 and 289. The molded packages 200 and 287 are next delaminated from the dicing tape 295.

Figure 17:
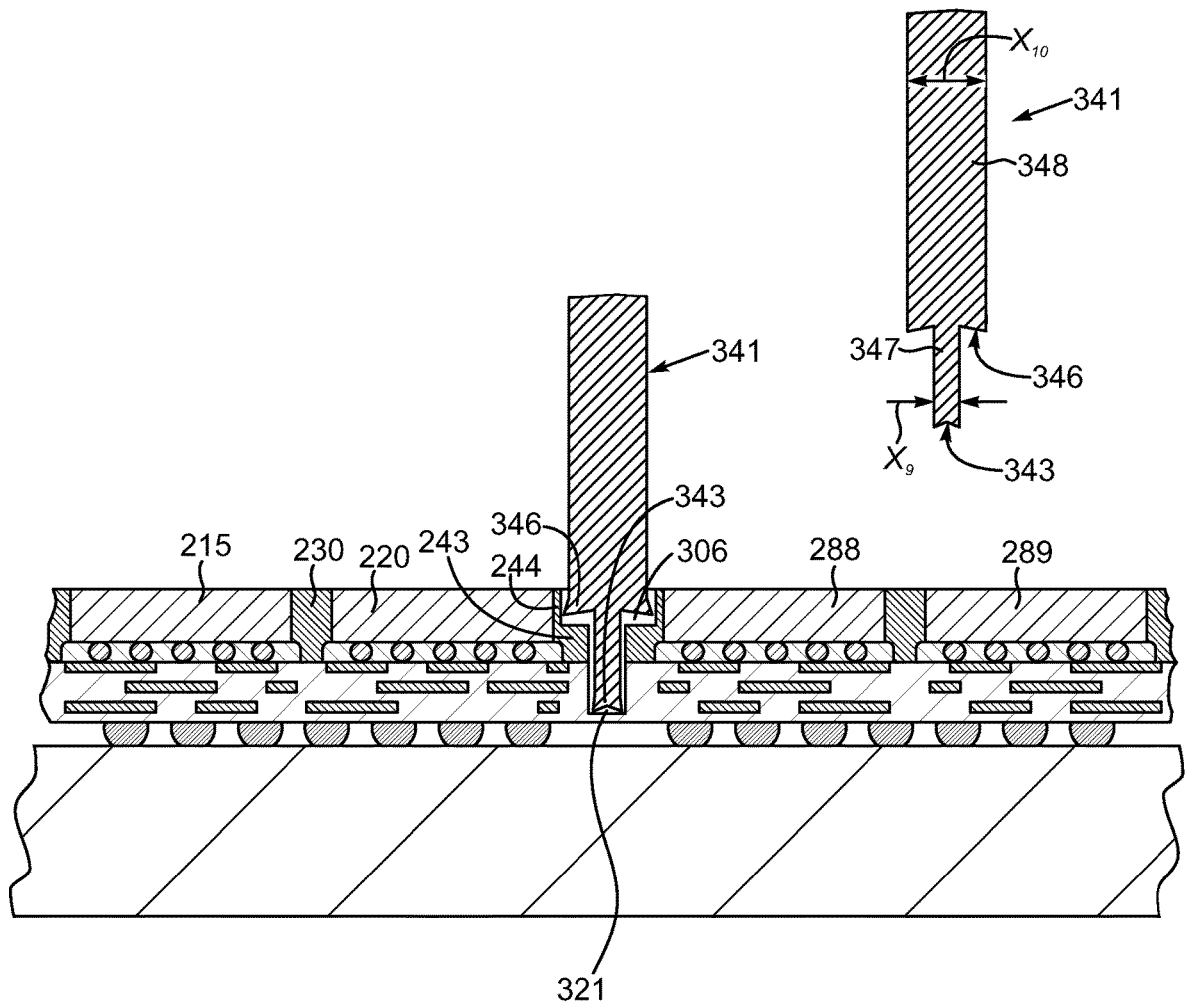
FIG. 17 is a sectional view depicting an exemplary dual kerf formation using a single cutting blade.

In another alternate exemplary method illustrated in FIG. 17, a single dicing operation is performed to establish the desired stair step configuration of the 230 molding layer using an alternate exemplary dicing blade 341 that is dual-width to provide two cutting surfaces 343 and 346. FIG. 17 shows the dicing blade 341 before and during a cutting operation. The radially outermost portion 347 of the blade 341 includes the cutting surface 343 and has width $x_9$ suitable to cut the narrow kerf 321 and the radially innermost portion 348 of the blade 341 includes the cutting surface 346 and has a width $x_{10}$ that is wider than the width $x_9$ such that the blade 341 can be brought into engagement with the molding layer 230, and by way of a single cutting operation, the narrow cutting surface 343 establishes the narrow deep kerf 321 that penetrates not only the molding layer 230 but also the entirety of the RDL 225 for singulation purposes while the wider cutting surface 346 establishes the shallower but wider kerf 306 that yields the aforementioned riser 244 and tread 243 that will surround the chips 215 and 220. Following additional such cuts and singulation and the riser 309 and tread 326 that will surround the chips 288 and 289. Following dicing, the dicing tape 295 can be delaminated using the techniques described elsewhere herein.

Figure 18:
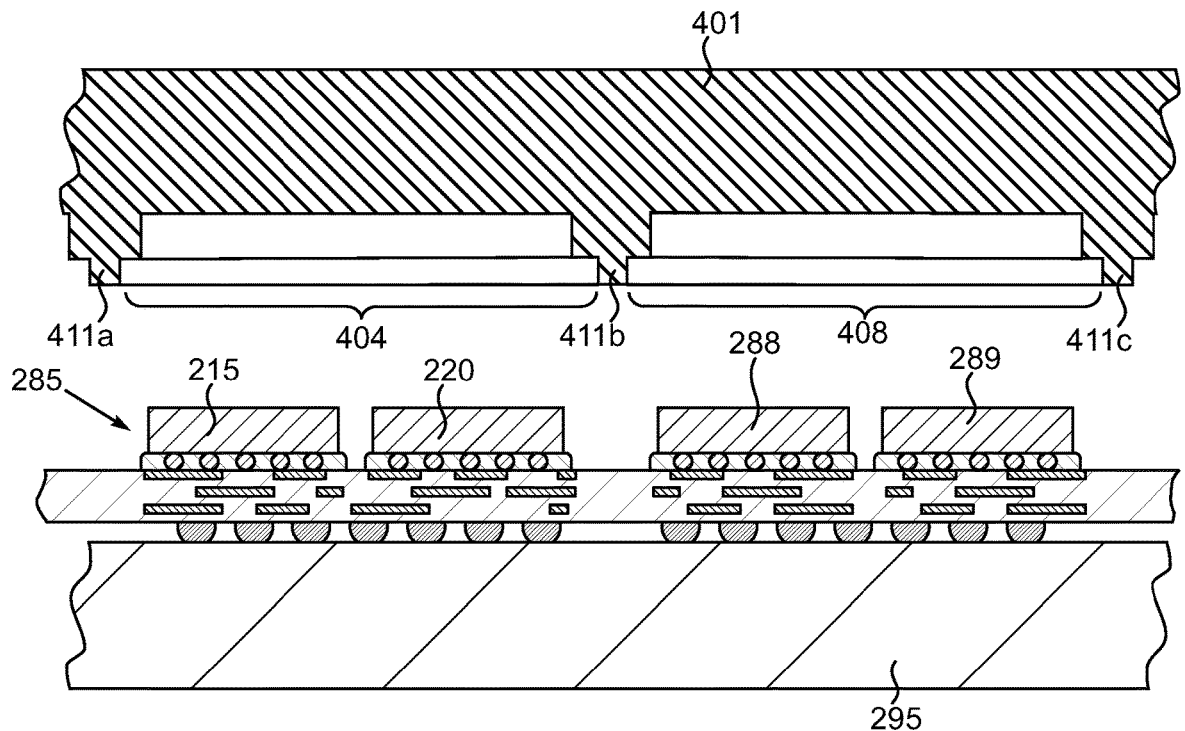
FIG. 18 is a sectional view depicting a small portion of a reconstituted wafer and initial positioning of a molding lid to facilitate stair-step molding.
Figure 19:
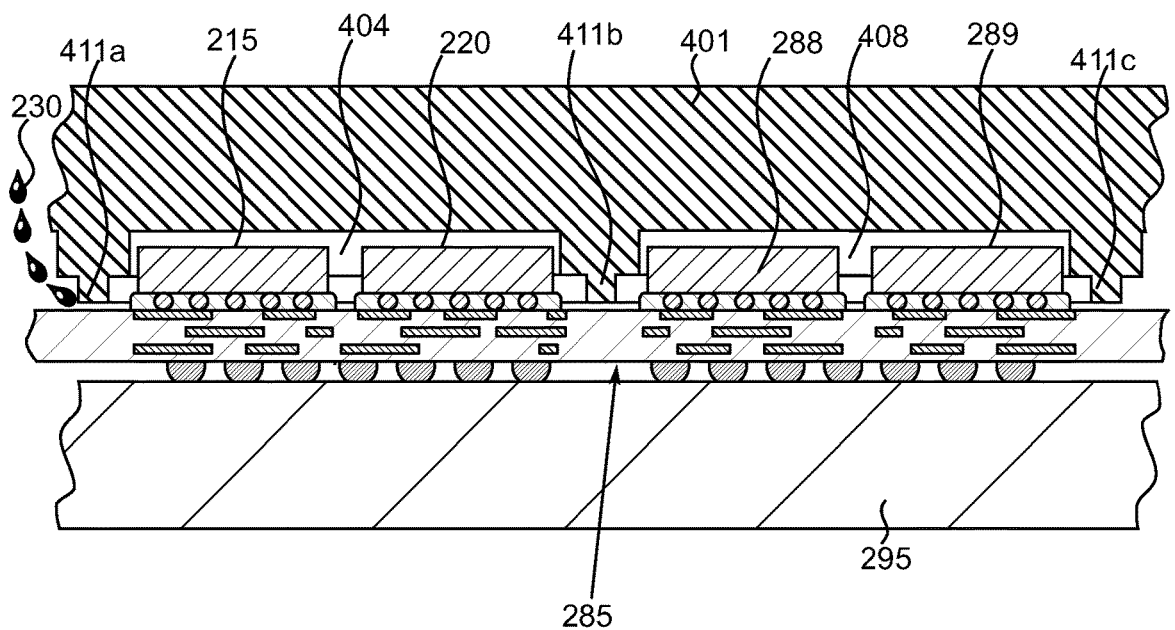
FIG. 19 is a sectional view like FIG. 18 but depicting the positioning of the mold lid and the molding of a stair-step molding layer.

In another exemplary method, a molding layer 230 is molded with a stair-step structure. This exemplary method can be understood by referring now to FIGS. 18, 19 and 20. As shown in FIG. 18, the reconstituted wafer 285 can be mounted onto either a dicing tape 295 or a carrier wafer (not shown) and thereafter a molding process performed to apply molding material 230 but using a molding lid 401 positioned over the semiconductor chips 215, 220, 288 and 289. The lid 401 has a plurality of stair-step cavities, two of which are visible and labeled 404 and 408, respectively. The stair-step cavities 404 and 408 are defined by downwardly projecting peripheral walls, three of which are visible and labeled 411a, 411b and 411c, respectively. The cavities 404 and 408 share the peripheral wall 411b. Indeed, when viewed from below, the cavities 404 and 408 (and others not visible) will resemble a waffle pattern. The cavity 404 is designed to accommodate the heights of the chips 215 and 220, and the cavity 408 is designed to accommodate the heights of the chips 288 and 289 when the lid 401 is positioned proximate the reconstituted wafer 285 just prior to molding. The peripheral wall 411b has the mirror image profile of the desired stair-step kerfs that would ordinarily be created using a double dicing process and so on for the other peripheral walls 411a and 411c. As shown in FIG. 19, the lid is positioned over the reconstituted wafer 285 to leave spaces around the chips 215, 220, 288 and 289 where the molding material 230 can flow during molding. However, the presence of the stair-step peripheral walls 411a, 411b and 411c with their stair-step shapes allows the molding material 230 to proceed around the chips 220 and 288 to automatically form a stair-step molding structure between the chips 220 and 288 and indeed surrounding the chips 215, 220, 288 and 289.

Figure 20:
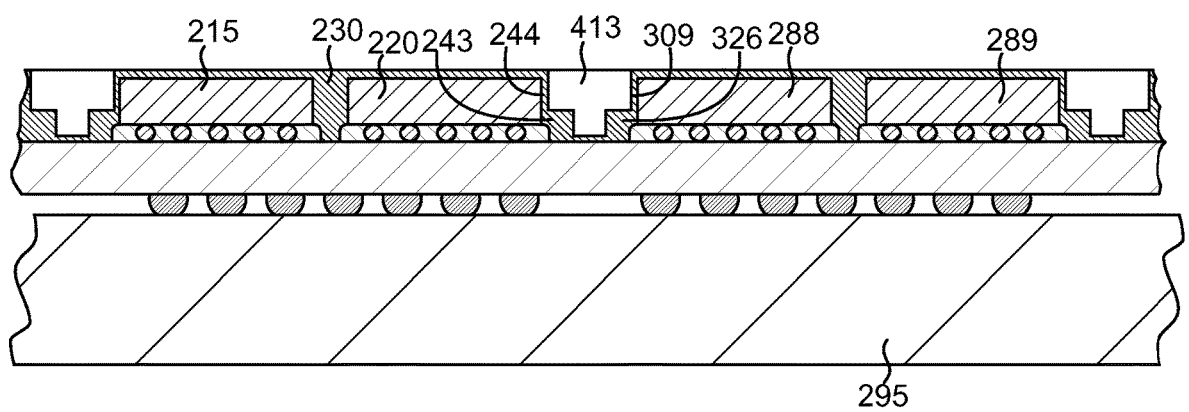
FIG. 20 is a sectional view like FIG. 19 but depicting the post molding state of the molding layer.

Following the molding process, and as shown in FIG. 20 the molding lid 401 shown in FIG. 19 is removed and as just noted the molding process itself yields the aforementioned molding layer 230 with a stair-step trench 413 that establishes the riser 244 and tread 243 adjacent and surrounding the semiconductor chips 215 and 220 and the corresponding riser 309 and tread 326 of the molding layer 230 adjacent to the semiconductor chips 288 and 289. Other trenches (not labeled) are similarly yielded adjacent the chips 215 and 289 and elsewhere.

Figure 21:
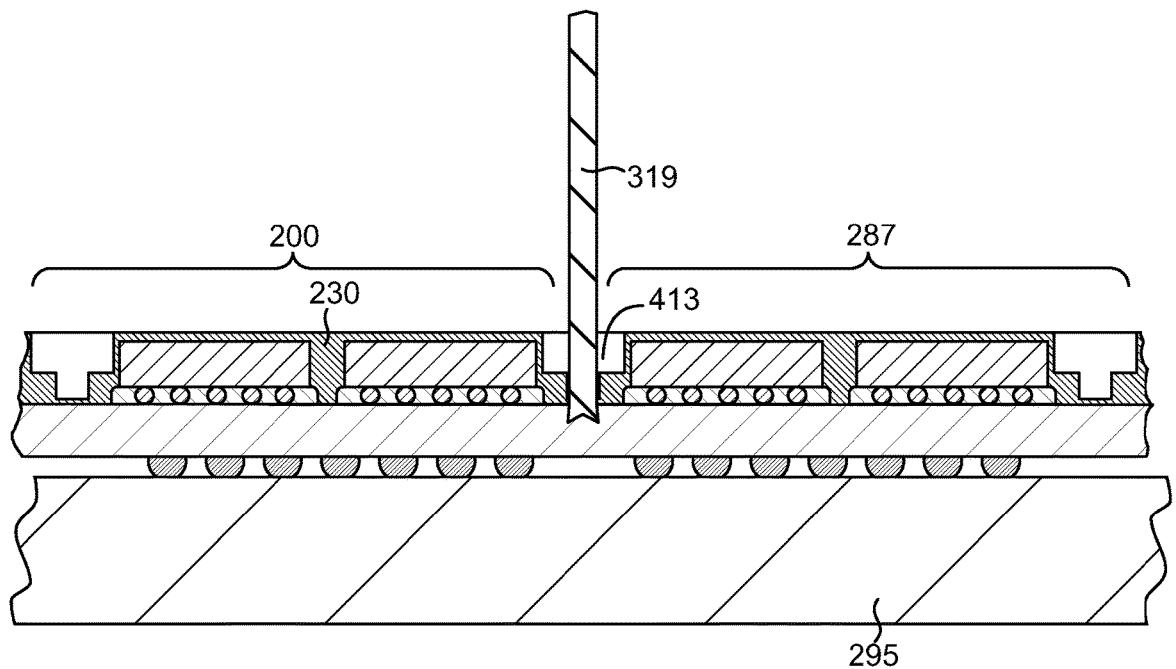
FIG. 21 is a sectional view like FIG. 20 but depicting exemplary singulation of the reconstituted wafer.

Next and as shown in FIG. 21, a dicing step is performed using, for example the saw blade 319, to cut down into the trench 413 and elsewhere to penetrate any molding at the bottom of the trench 413 and the entire depth of the routing substrate 225 to singulate the molded packages 200 and 293 as described above.

Figure 22:
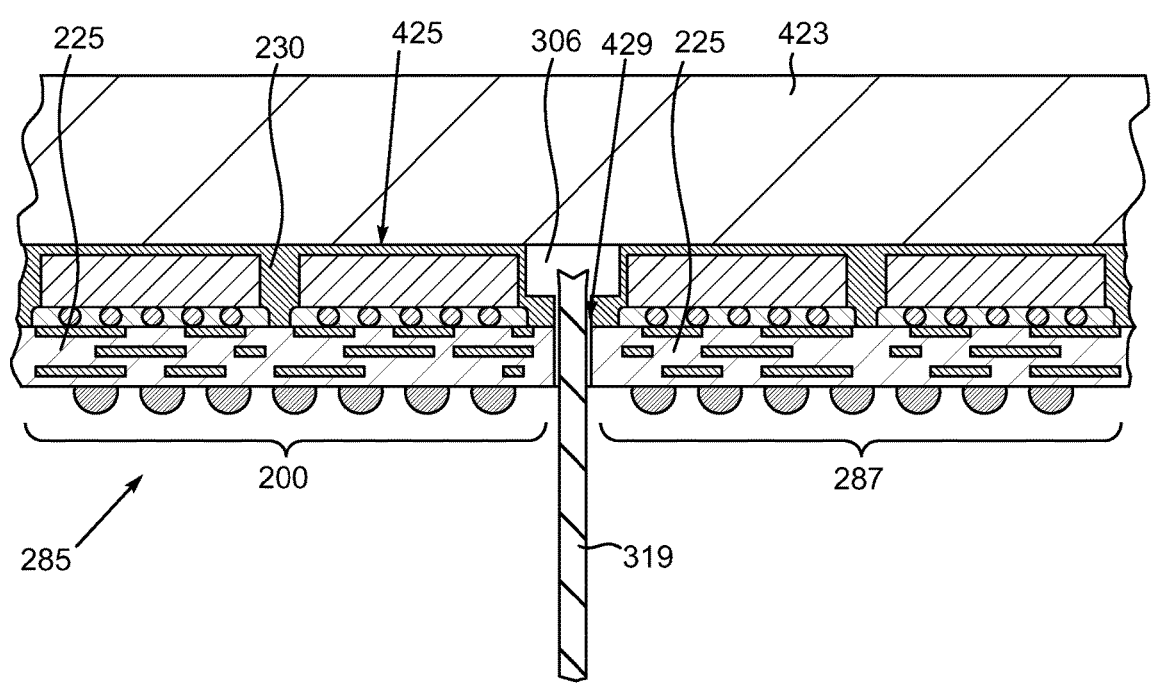
FIG. 22 a sectional view like FIG. 21 but depicting singulation dicing from an opposite side of the reconstituted wafer.

It should be understood that in the foregoing processes involving dicing steps or even structured molding as in FIGS. 18-21, the cutting action is from a direction facing towards the tops of the semiconductor chips 215, 220, etc. However, it should be understood that the actual singulation dicing step that cuts through the RDL structure and a portion of the molding can be conducted from the RDL structure side and not the chip side for any of the disclosed processes. In this respect, attention is now turned to FIG. 22 which is a sectional view of the reconstituted wafer 285, albeit mounted to a carrier wafer 423. In this arrangement, rather than mounting the RDL structure side of the reconstituted wafer 285 on some sort of carrier substrate, the molding layer side 425 proximate the chips 215, 220, 288 and 289 is mounted on the carrier wafer 423. Prior to mounting the reconstituted wafer 285 on the carrier wafer 423, the kerf 306 is cut into the molding 230 using the techniques and cutting blade 303 depicted in FIG. 11. Following the creation of the kerf 306, and mounting to the carrier wafer 423, a second full singulation cutting step is performed using the dicing blade 319, albeit from beneath, that is up through the routing substrate 225, to cut a kerf 429 that penetrates through to the kerf 306. At this point, the molded packages 200 and 287 can be separated from the carrier substrate 423 using well-known techniques.

Figure 23:
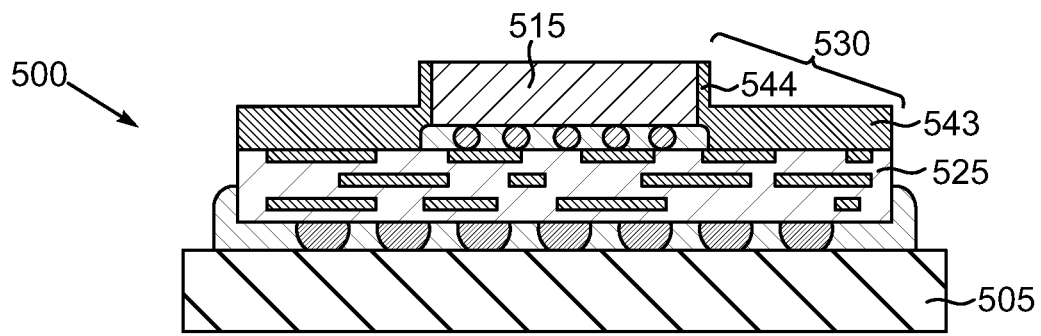
FIG. 23 is a sectional view depicting an alternate exemplary molded semiconductor chip package.

In the foregoing illustrative arrangements, the molded package 200 typically includes side by side semiconductor chips 215 and 220 in a 2.5D arrangement. However, the skilled artisan will appreciate that a variety of different types of molding packages can be manufactured using the aforementioned techniques to establish a molding layer that has the stair-step structure with the stress reduction benefits. For example and as shown in FIG. 23, a molded package 500 can include a single semiconductor chip 515, the routing structure 525 mounted on a package substrate 505 and a molding layer 530 that has the aforementioned stair-step structure that includes a tread 543 and a riser 544. For a single chip 515, the tread 543 can be wider than the risers 243 described above or not. In other aspects, the molded package 500 can be substantially similar to the package 200 described above.

Figure 24:
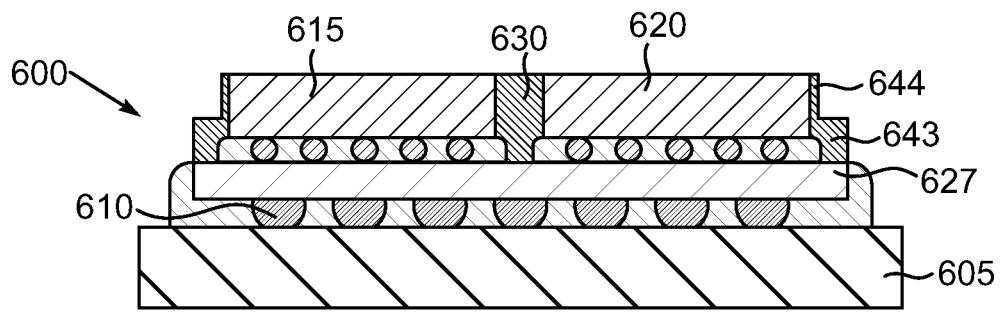
FIG. 24 is a sectional view depicting another alternate exemplary arrangement of a molded semiconductor chip package.

In yet another illustrative arrangement, a molded semiconductor chip package 600 shown in FIG. 24 can include multiple semiconductor chips 615 and 620 mounted into 2.5D arrangement on a routing structure 627 in the form of an interposer. The routing structure (interposer) 627 can be constructed of silicon, other types of semiconductors or even the glass structures and is electrically connected to the package substrate 605 by way of interconnect structures 610. Again, a molding layer 630 is fabricated with the aforementioned tread 643 and riser 644 to provide stress reduction as described above.

Figure 25:
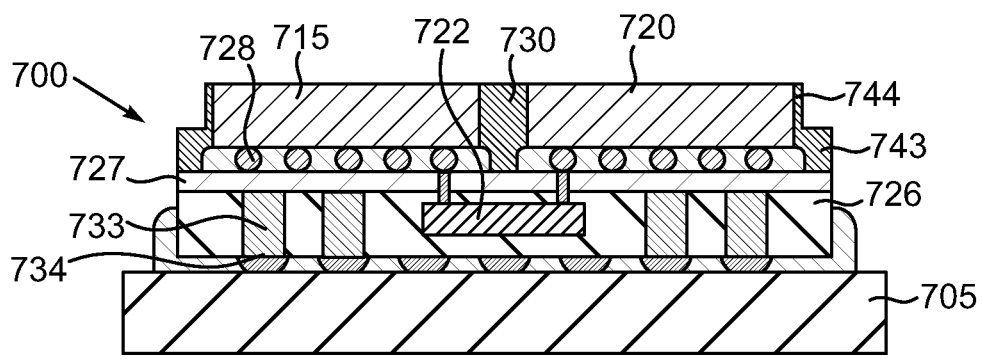
FIG. 25 is a sectional view of another alternate exemplary arrangement of a molded semiconductor chip package.

As shown in FIG. 25, another exemplary semiconductor chip package 700 mountable on a package substrate 705 can include semiconductor chips 715 and 720 interconnected by an interconnect chip 722 that is encased in a molding layer 726. A thin RDL structure 727 is fabricated on molding layer 726. The semiconductor chips 715 and 720 include interconnects 728, some of which are connected to the thin RDL structure 727 and others of which are connected to the interconnect chip 722. The molding layer 726, the thin RDL structure 727 and the interconnect chip 722 provide a routing substrate. A second molding 730 can be fabricated to at least partially encased the chip 715 and 720 and using the techniques described elsewhere herein to establish the aforementioned tread 743 and riser 744 to provide stress reduction. The molding layer 729 can be populated with plural conductive pillars 733 that are connected to the package substrate 705 by interconnect structures 734. The thin RDL structure 728 provides routing between the semiconductor chips 715 and 720 and the conductive pillars 733.

Figure 26:
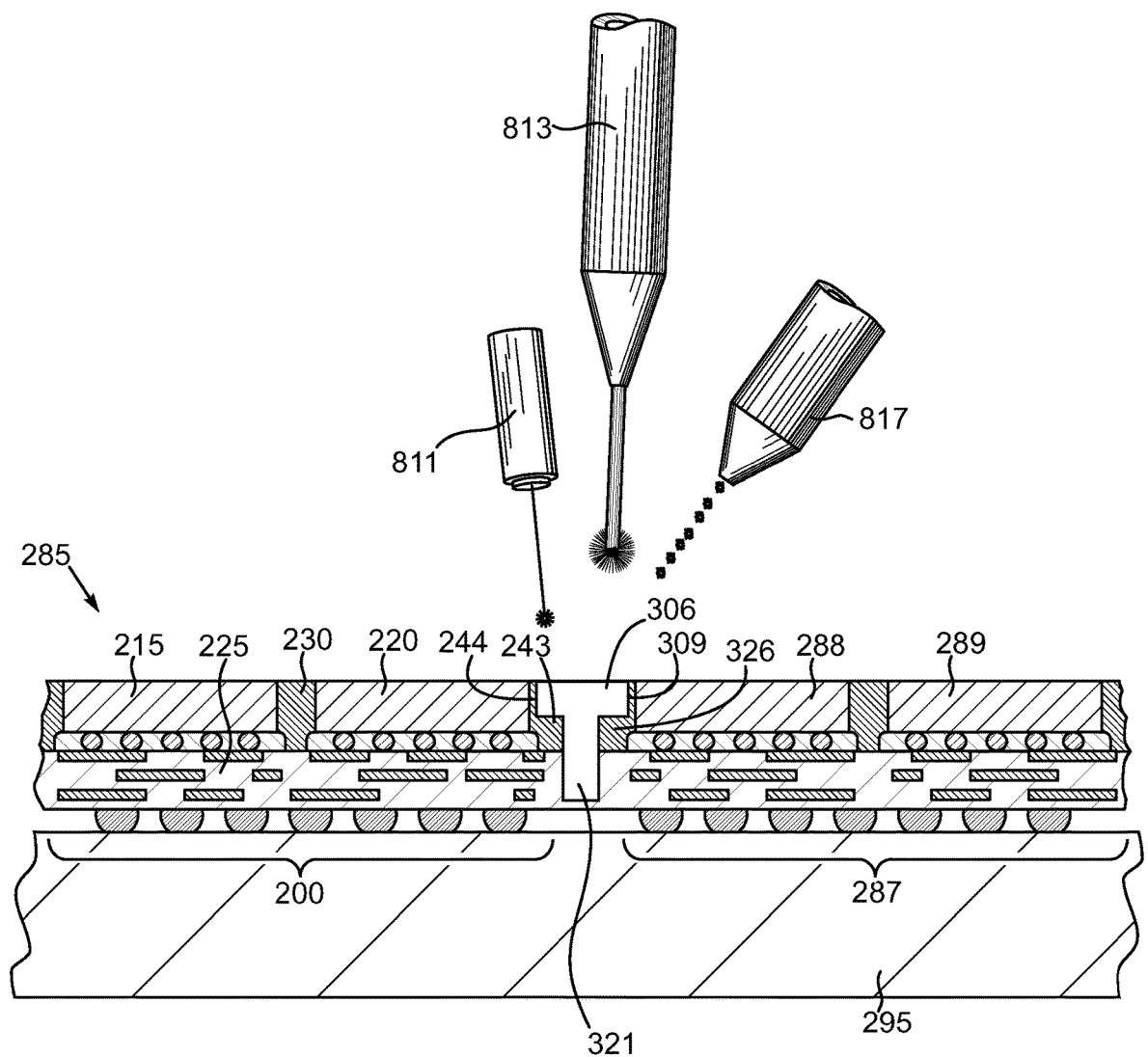
FIG. 26 is a sectional view depicting various alternate exemplary kerf formation and singulation techniques.

In the foregoing exemplary described arrangements and techniques, stair-step dicing is performed by way of mechanical sawing using dicing blades. However, the skilled artisan will appreciate that other dicing techniques can used. Attention is now turned to FIG. 26, which is a sectional view like FIG. 13, but illustrating various optional kerf formation and singulation techniques. FIG. 26 depicts the reconstituted wafer 285 with the semiconductor chips 215 and 220 of the molded package 200, the semiconductor chips of the adjacent molded package 287 288 and 289, and the molding layer 230 in place on the RDL structure 225. The reconstituted wafer 285 is mounted on the dicing tape 295. The wide kerf 306 can be cut in the molding layer 230 and the narrow kerf 321 can be cut in both the molding layer 230 and through the RDL structure 225 using, for example, a laser 811, a water jet mill 813 or a grit blaster 817, some combination of these or even some combination of one or more of these with mechanical sawing. These represent just three possible alternative cutting techniques. Again four separate cuts on each of the dicing streets 294, 311, 312 and 316 (see FIG. 12) will be performed to complete the singulation of the molded packages 200 and 287. The cutting steps can be performed to yield the aforementioned riser 244 and tread 243 of the molding layer 230 that surrounds the chips 215 and 220, and the similar riser 309 and tread 326 surrounding the semiconductor chips 288 and 289. Following the singulation, the dicing tape 295 can be removed and the molded packages 200 and 287 yielded.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A semiconductor chip package, comprising:
a routing substrate;
a semiconductor chip mounted on and electrically connected to the routing substrate, the semiconductor chip having plural side surfaces;
another semiconductor chip having plural other side surfaces mounted on the routing substrate;
an underfill between the routing substrate and the semiconductor chip; and
a molding layer at least partially encasing the semiconductor chip, the molding layer having a tread and a riser, the riser abutting at least some of the plural side surfaces of the semiconductor chip and at least some of the plural other side surfaces of the another semiconductor chip, wherein a top surface of the tread is higher than a top surface of the underfill, and wherein a top surface of the riser abuts the at least some of the plural side surfaces of the semiconductor chip, and wherein a portion of the top surface of the tread laterally overlaps and is positioned over a top edge of the underfill.

2. The semiconductor chip package of claim 1, wherein the riser is narrower than the tread.

3. The semiconductor chip package of claim 1, wherein the routing substrate comprises a redistribution layer (RDL) structure.

4. The semiconductor chip package of claim 1, wherein the routing substrate comprises an interposer.

5. The semiconductor chip package of claim 1, wherein the routing substrate comprises another molding layer containing an interconnect chip connecting the semiconductor chip to the another semiconductor chip.

6. The semiconductor chip package of claim 1, wherein the routing substrate comprises plural interconnect structures to electrically connect the semiconductor chip package to another electronic device.

7. A reconstituted wafer, comprising:
plural semiconductor chip packages, each of the semiconductor chip packages including a routing substrate,
a semiconductor chip having plural side surfaces and being mounted on and electrically connected to the routing substrate,
another semiconductor chip having plural other side surfaces mounted on and electrically connected to the routing substrate,
an underfill between the routing substrate and the semiconductor chip, and
a molding layer at least partially encasing the semiconductor chip, the molding layer having a tread and a riser, the riser abutting at least some of the plural side surfaces of the semiconductor chip and at least some of the plural other side surfaces of the another semiconductor chip, wherein a top surface of the tread is higher than a top surface of the underfill, and wherein a top surface of the riser abuts the at least some of the plural side surfaces of the semiconductor chip, and wherein a portion of the top surface of the tread laterally overlaps and is positioned over a top edge of the underfill.

8. The reconstituted wafer of claim 7, wherein the risers are narrower than the treads.

9. The reconstituted wafer of claim 7, wherein the routing substrates comprises redistribution layer (RDL) structures.

10. The reconstituted wafer of claim 7, wherein the routing substrates comprises interposers.

11. The reconstituted wafer of claim 7, wherein the routing substrate comprises another molding layer containing an interconnect chip connecting the semiconductor chip to the another semiconductor chip.

12. The reconstituted wafer of claim 7, wherein each of the routing substrates comprises plural interconnect structures to electrically connect to another electronic device.

13. A method of manufacturing a semiconductor chip package, comprising:
mounting a semiconductor chip having plural side surfaces on a routing substrate and electrically connecting the semiconductor chip to the routing substrate;
mounting another semiconductor chip having plural other side surfaces on the routing substrate and electrically connecting the semiconductor chip to the routing substrate;
providing an underfill between the routing substrate and the semiconductor chip; and
molding a molding layer on the routing substrate to at least partially encase the semiconductor chip, the molding layer having a tread and a riser, the riser abutting at least some of the plural side surfaces of the semiconductor chip and at least some of the plural other side surfaces of the another semiconductor chip, wherein a top surface of the tread is higher than a top surface of the underfill, and wherein a top surface of the riser abuts the at least some of the plural side surfaces of the semiconductor chip, and wherein a portion of the top surface of the tread laterally overlaps and is positioned over a top edge of the underfill.

14. The method of claim 13, comprising fabricating the tread and the riser during the molding.

15. The method of claim 13, comprising fabricating the tread and the riser by sawing a first kerf having a first width to set a width of the riser and sawing a second kerf aligned with the first kerf and having a second width narrower than the first width to set a width of the tread.

16. The method of claim 15, comprising sawing the first kerf and the second kerf into a same side of the molding layer.

17. The method of claim 15, comprising sawing the first kerf and the second kerf into opposite sides of the molding layer.

18. The method of claim 13, wherein the routing substrate and the molding layer comprises a reconstituted wafer.

19. The method of claim 13, wherein the riser is narrower than the tread.

20. The method of claim 13, wherein the routing substrate comprises a redistribution layer (RDL) structure.

21. The method of claim 13, wherein the routing substrate comprises an interposer.

22. The method of claim 13, wherein the routing substrate comprises another molding layer containing an interconnect chip connecting the semiconductor chip to the another semiconductor chip.

* * * * *